(12) United States Patent
Corsi

(10) Patent No.: US 11,101,769 B2
(45) Date of Patent: Aug. 24, 2021

(54) MULTI-CHANNEL INVERTER FOR A PHOTOVOLTAIC APPARATUS

(71) Applicant: ABB Schweiz AG, Baden (CH)

(72) Inventor: Alessandro Corsi, San Giovanni Valdarno (IT)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 16/813,185

(22) Filed: Mar. 9, 2020

(65) Prior Publication Data

US 2020/0295706 A1    Sep. 17, 2020

(30) Foreign Application Priority Data

Mar. 12, 2019   (EP) ..................... 19162361

(51) Int. Cl.
| | |
|---|---|
| *H02S 40/32* | (2014.01) |
| *H02M 7/00* | (2006.01) |
| *H02M 7/44* | (2006.01) |
| *H02M 1/32* | (2007.01) |

(52) U.S. Cl.
CPC ............ *H02S 40/32* (2014.12); *H02M 7/003* (2013.01); *H02M 7/44* (2013.01); *H02M 1/325* (2021.05)

(58) Field of Classification Search
CPC ......... H02S 40/32; H02M 7/003; H02M 7/44; H02M 2001/325
See application file for complete search history.

(56) References Cited

U.S. PATENT DOCUMENTS

| | | | |
|---|---|---|---|
| 2009/0195081 A1* | 8/2009 | Quardt ............. | H01L 31/02021 307/125 |
| 2011/0084553 A1* | 4/2011 | Adest ...................... | H02J 7/00 307/63 |
| 2012/0175964 A1* | 7/2012 | Yoscovich ............. | H02J 3/381 307/82 |
| 2017/0222542 A1* | 8/2017 | Adest ...................... | H02J 3/46 |

FOREIGN PATENT DOCUMENTS

| | | |
|---|---|---|
| CN | 102520254 A | 6/2012 |
| CN | 106603007 B | 9/2018 |

OTHER PUBLICATIONS

European Patent Office, Extended Search Report issued in corresponding Application No. 19162361.0, dated Sep. 12, 2019, 9 pp.

* cited by examiner

*Primary Examiner* — Jue Zhang
(74) *Attorney, Agent, or Firm* — Taft Stettinius & Hollister LLP

(57) ABSTRACT

An inverter for a photovoltaic apparatus, which includes a DC section, a DC/AC conversion section, an AC section and a control section. The DC section includes a plurality of DC input channels each including a DC/DC converter electrically connected between input terminals and the output terminals of the DC input channels. The inverter includes a measuring circuit arrangement adapted to measure an isolation resistance of the photovoltaic strings electrically connected with the DC input channels, when the inverter operates in predefined test conditions.

20 Claims, 6 Drawing Sheets

MULTI-CHANNEL INVERTER FOR A PHOTOVOLTAIC APPARATUS

Figure 1:
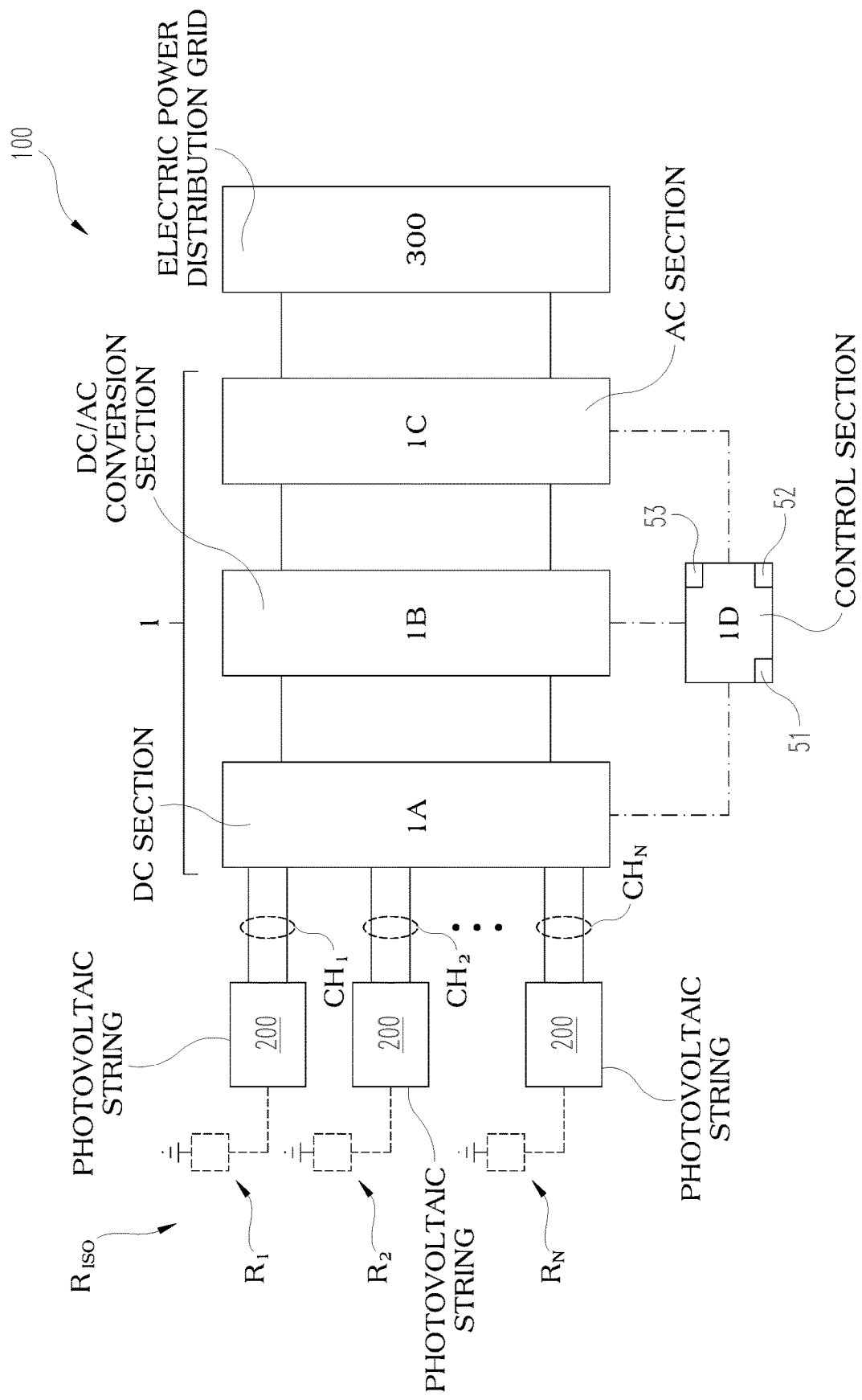

The present invention relates to a multi-channel inverter for a photovoltaic apparatus.

Multi-channel inverters are widely used in photovoltaic apparatuses including multiple photovoltaic strings.

A multi-channel inverter generally comprises a DC section including a plurality of DC input channels receiving DC electric power from corresponding photovoltaic strings, an DC/AC conversion section providing a DC/AC conversion of DC electric power provided by the photovoltaic strings and an AC section providing AC electric power to an electric power distribution grid, for example the mains.

When the inverter is capable of carrying out MPPT (Maximum Power Point Tracking) functionalities, each DC input channel typically includes a DC/DC converter adapted to receive an input DC voltage from a corresponding photovoltaic string and provide an output DC voltage having a controllable voltage value to the DC/AC conversion section.

As is known, many types of multi-channel inverters are not provided with electric isolation arrangements (e.g. an electric transformer) adapted to galvanically isolate the DC section and the AC section.

In these cases, current international regulations lay down that the resistive impedance towards ground (normally referred to as "isolation resistance") of the photovoltaic strings has to be cyclically measured under suitable test conditions of the inverter.

In most of the cases, the isolation resistance is measured by providing a suitable detection circuit between the input terminals of the DC/AC conversion section and the ground.

In inverters providing MPPT functionalities, the above-mentioned technical solution is applicable only when the DC input channels have their positive or negative electric lines substantially equipotential.

However, such a technical solution cannot be adopted when DC/DC converters having a double-level configuration are arranged at the DC input channels to provide relatively high output voltages (i.e. higher than 1 kV) to the DC/AC conversion section. In this case, in fact, diodes are present on both the electric lines of each DC input channel and, consequently, the DC input channels cannot have their positive or second electric lines equipotential.

In order to solve this problem, various measuring circuit arrangements have been proposed in the state of the art, some examples of which are described in CN106603007B.

Unfortunately, the experience has shown that currently available solutions do not yet ensure accurate and reliable measurements of the isolation resistance of the photovoltaic strings.

Additionally, it is not possible to preventively check whether active components (switches) in the designed measuring arrangements are correctly operating when the isolation resistance measurements are required.

Of course, the above-mentioned drawbacks may lead to unacceptable and potentially dangerous errors in measuring the isolation resistance of the photovoltaic strings.

The main aim of the present invention is to provide a multi-channel inverter for a photovoltaic apparatus, which enables the disadvantages described above to be overcome. Within this aim, another object of the present invention is to provide a multi-channel inverter, in which the isolation resistance can be measured in an accurate and reliable manner even when the inverter is designed to provide MPPT functionalities and the DC input channels of the inverter do not have any equipotential electric lines.

Another object of the present invention is to provide a multi-channel inverter, which has a compact structure with a relatively small size.

Yet another object of the present invention is to provide a multi-channel inverter, which is easy and inexpensive to produce at industrial level.

This aim and these objects, together with other objects that will be more apparent from the subsequent description and from the accompanying drawings, are achieved, according to the invention, by an inverter, according to claim 1 and the related dependent claims.

Figure 2:
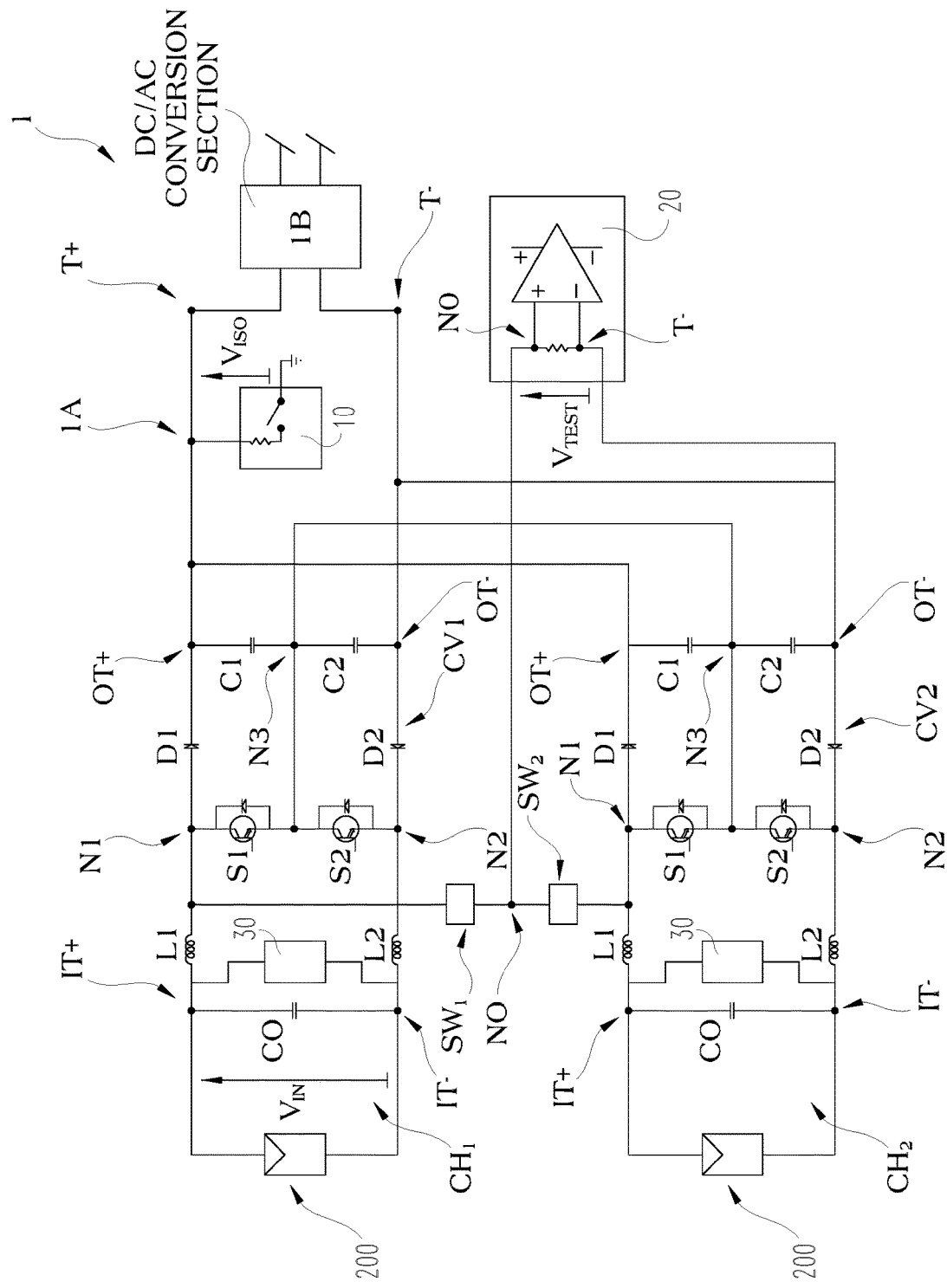
Figure 2A:
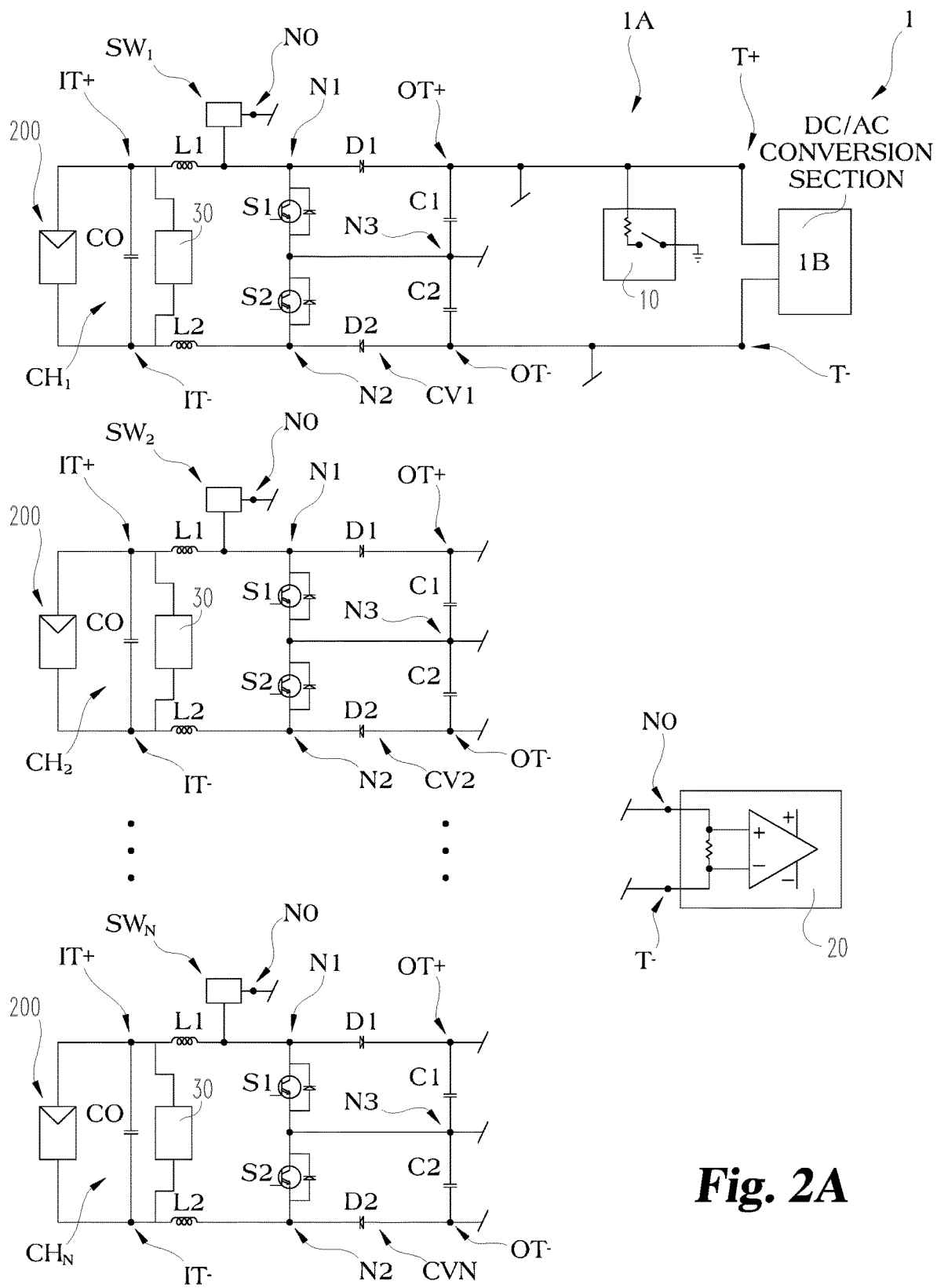

Characteristics and advantages of the present invention will be more apparent with reference to the description given below and to the accompanying figures, provided purely for explanatory and non-limiting purposes, wherein:

FIG. 1 schematically illustrates a photovoltaic apparatus including an inverter, according to the present invention;

FIG. 2 schematically illustrates a partial view of a two-channel inverter, according to the present invention;

FIG. 2A schematically illustrates a partial view of a multi-channel inverter, according to the present invention;

FIGS. 3-6 schematically illustrate some aspects of the inverter, according to the present invention.

With reference to the aforesaid figures, the present invention relates to an inverter 1 for a low voltage photovoltaic apparatus 100.

For the sake of clarity, it is specified that the term "low voltage" refers to operating voltages lower than 1 kV AC and 2 kV DC.

Referring to FIG. 1, a photovoltaic apparatus 100 including the inverter 1 is shown. The photovoltaic apparatus 100 comprises one or more photovoltaic strings 200, each of which may comprise one or more photovoltaic panels.

The photovoltaic strings 200 are electrically connected with the inverter 1 that in turns is electrically connected with an electric power distribution grid 300 (e.g. the mains or a load circuit).

In general, the inverter 1 is adapted to receive DC electric power from the photovoltaic strings, to convert said DC electric power into AC electric power and to provide said Ac electric power to the electric power distribution grid.

The inverter 1 comprises a DC section 1A, an DC/AC conversion section 1B and an AC section 1C.

The DC section 1A includes a DC bus electrically connected with the photovoltaic strings 200 to receive DC electric power from these latter.

According to the invention, the inverter 1 is of the multi-channel type.

The DC section 1A thus comprises a DC bus formed by a plurality of DC input channels $CH_1$, $CH_2$, $CH_N$, each of which has an input port adapted to be electrically connected with a corresponding photovoltaic string 200 and an output port electrically connected with the DC/AC conversion section 1B.

The DC/AC conversion section 1B is electrically connected between the DC section 1A and the AC section 1C.

Conveniently, the DC/AC conversion section 1B comprises an input port (also referred to as "DC-link") electrically connected in parallel with all the output ports of the DC input channels $CH_1$, $CH_2$, $CH_N$ of the DC section 1A and an output port electrically connected with the AC section 1C

Preferably, the DC/AC conversion section 1B comprises one or more DC/AC converters adapted to provide a DC/AC conversion of DC electric power provided by the photovoltaic strings 200 into AC electric power.

The AC section 1C of the inverter 1 is electrically connected with the DC/AC conversion section 1B and the electric power distribution grid 300.

Preferably, the AC section 1C comprises an input port electrically connected with the output port of the DC/AC conversion section 1B and a suitable AC bus adapted to deliver the AC electric power provided by the DC/AC conversion section 1B to the electric power distribution grid 300.

In general, the DC/AC conversion section 1B and the AC section 1C of the inverter 1 may be of known type and will not be further described in further details for the sake of brevity.

In FIG. 2, an embodiment of the inverter 1 having two DC input channels $CH_1$, $CH_2$ is shown while, in FIG. 2A, an embodiment of the inverter 1 having a generic number of N (N>2) DC input channels $CH_1$, $CH_2$, $CH_N$ is shown.

Each DC input channel $CH_1$, $CH_2$, $CH_N$ comprises an input port formed by a first input terminal IT+ (e.g. having a positive voltage polarity) and a second input terminal IT− (e.g. having a negative voltage polarity) electrically couple-able with output terminals of a corresponding photovoltaic string 200.

Each DC input channel $CH_1$, $CH_2$, $CH_N$ comprises an output port formed by a first output terminal OT+ (e.g. having a positive voltage polarity) and a second output terminal OT− (e.g. having a negative voltage polarity).

The output terminals OT+ and OT− of each DC input channel $CH_1$, $CH_2$, $CH_N$ are electrically coupled respectively with third and fourth input terminals T+ and T− (e.g. having a positive and negative voltage polarity, respectively) of the DC/AC conversion section 1B, which form the input port of this latter section of the inverter 1. In this way, the output ports of the DC input channels $CH_1$, $CH_2$, $CH_N$ are electrically connected in parallel with the input port of the DC/AC conversion section 1B.

Each DC input channel $CH_1$, $CH_2$, $CH_N$ comprises a first electric line L+ (e.g. having a positive voltage polarity) between and including the first input and output terminals IT+ and OT+ and a second electric line L− (e.g. having a negative voltage polarity) between and including the second input and output terminals IT− and OT−.

According to the invention, the DC section 1A comprises a DC/DC converter $CV_1$, $CV_2$, $CV_N$ for each DC input channel $CH_1$, $CH_2$, $CH_N$.

Each DC/DC converter $CV_1$, $CV_2$, $CV_N$ is electrically connected between the input terminals IT+, IT− and the output terminals OT+, OT− of the corresponding DC input channel $CH_1$, $CH_2$, $CH_N$.

Each DC/DC converter $CV_1$, $CV_2$, $CV_N$ comprises one or more first components electrically connected in series with the first input and output terminals IT+, OT+ of the corresponding DC input channel $CH_1$, $CH_2$, $CH_N$ and are part of the first electric line L+ of said DC input channel. Each DC/DC converter $CV_1$, $CV_2$, $CV_N$ comprises one or more second components electrically connected in series with the second input and output terminals IT−, OT− of the corresponding DC input channel $CH_1$, $CH_2$, $CH_N$ and are part of the second electric line L− of said DC input channel.

According to some embodiments of the invention, said first components may include at least a diode arranged in such a way to allow the circulation of a current along the first electric line L+ with a flow direction going from the first input terminal IT+ to the first output terminal OT+ and/or said second components may include at least a diode arranged in such a way to allow the circulation of a current along the second electric line L− with a flow direction going from the second output terminal OT− to the second input terminal IT−.

Preferably, as shown in FIGS. 2 and 2A, each DC/DC converter $CV_1$, $CV_2$, $CV_N$ has a so-called "two-level boost configuration".

In the embodiments of FIGS. 2 and 2A, each DC/DC converter $CV_1$, $CV_2$, $CV_N$ comprises a first inductance L1 and a first diode D1 arranged along the first electric line L+ of the corresponding DC input channel $CH_1$, $CH_2$, $CH_N$.

The first inductance L1 is electrically connected between the first input terminal IT+ and a first intermediate node N1 of the first electric line L+ whereas the first diode D1 has its anode electrically connected with the first intermediate node N1 and its cathode electrically connected with the first output terminal OT+.

In the embodiments of FIGS. 2 and 2A, each DC/DC converter $CV_1$, $CV_2$, $CV_N$ comprises a second inductance L2 and a second diode D2 arranged along the second electric line L− of the corresponding DC input channel $CH_1$, $CH_2$, $CH_N$.

The second inductance L2 is electrically connected between the second input terminal IT− and a second intermediate node N2 of the second electric line L− whereas the second diode D2 has its cathode electrically connected between the second intermediate node N2 and its anode electrically connected with the second output terminal OT−.

In the embodiments of FIGS. 2 and 2A, each DC/DC converter $CV_1$, $CV_2$, $CV_N$ further comprises an input capacitance C0 electrically connected in parallel with the input terminals IT+, IT− of the corresponding DC input channel $CH_1$, $CH_2$, $CH_N$, a first switch S1 electrically connected between the first intermediate node N1 and a third intermediate node N3, a first output capacitance C1 electrically connected between the first output terminal OT+ and the third intermediate node N3, a second switch S2 electrically connected between the second intermediate node N2 and the third intermediate node N3 and a second output capacitance C2 electrically connected between the second output terminal OT− and the third intermediate node N3.

The first and second switches S1 and S2 (e.g. MOSFETs) of each DC/DC converter $CV_1$, $CV_2$, $CV_N$ generally operate in response to first control signals (not shown) received in input.

In the embodiments of FIGS. 2 and 2A, the third intermediate nodes N3 of the DC/DC converters $CV_1$, $CV_2$, $CV_N$ of all the DC input channels $CH_1$, $CH_2$, $CH_N$ are electrically connected one with another in such a way to be equipotential.

As it may be noticed, in the embodiments of FIGS. 2 and 2A, the first diode D1 and the first inductance L1 therefore constitute the above-mentioned first components of the DC/DC converter $CV_1$, $CV_2$, $CV_N$, which are electrically connected in series with the first input and output terminals IT+, OT+ of the corresponding DC input channel $CH_1$, $CH_2$, $CH_N$ along the first electric line L+ of said DC input channel.

On the other hand, the second diode D2 and the second inductance L2 constitute the above-mentioned second components of the DC/DC converter $CV_1$, $CV_2$, $CV_N$, which are electrically connected in series with the second input and output terminals IT−, OT− of the corresponding DC input channel $CH_1$, $CH_2$, $CH_N$ along the second electric line L− of said DC input channel.

According to the invention, the DC section 1A of the inverter 1 comprises a measuring circuit arrangement for measuring the isolation resistance $R_{ISO}$ of the photovoltaic strings 200, when said inverter operates at predefined test conditions.

For the sake of clarity, it is specified that the term "isolation resistance" identifies the overall resistive impedance $R_{ISO}$ towards ground of the photovoltaic strings 200, which is substantially given by the parallel of the single resistive components $R_1$, $R_2$ $R_N$ of the impedances towards ground of the single photovoltaic strings 200.

For the sake of clarity, it is specified that, when it operates under said predefined test conditions, the inverter 1 carries out no power conversion functionalities.

Thus, when the inverter 1 operates under said predefined test conditions:
 each DC/DC converter $CV_1$, $CV_2$, $CV_N$ of the DC section 1A is deactivated and has its active elements (switches S1 and S2) in an interdiction state;
 the DC/AC converters of the DC/AC conversion section 1B are deactivated and have their active elements (switches) in an interdiction state;
 a DC current, which is fed by the corresponding photovoltaic string 200, may flow along the first and second electric lines L+ and L− of each DC input channel $CH_1$, $CH_2$, $CH_N$.

As it may be noticed, in the embodiments of FIGS. 2 and 2A, when inverter 1 operates under said test conditions, a DC current may flow along the electric line L+ and L− of the corresponding DC input channel $CH_1$, $CH_2$, $CH_N$ only.

The switches S1 and S2 of each DC/DC converter $CV_1$, $CV_2$, $CV_N$ are in an interdiction state and are equivalent to open circuits.

The first intermediate node N1 of the first electric line L+ is substantially equipotential (namely short-circuited, apart the presence of possible parasitic resistances) with the first input terminal IT+ whereas the second intermediate node N2 of the second electric line L− is substantially equipotential (namely short-circuited, apart the presence of possible parasitic resistances) with the second input terminal IT−. The first and second inductances L1, L2 are substantially equivalent to short-circuits as their impedance is virtually null for very low or null operating frequencies.

No DC currents flow along the input capacitance C0 and the output capacitances C1 and C2. These latter which are substantially equivalent to open circuits as their impedance is virtually infinite for very low or null operating frequencies.

According to the invention, the above-mentioned measuring circuit arrangement comprises a switch circuit $SW_1$, $SW_2$, $SW_N$ for each DC input channel $CH_1$, $CH_2$, $CH_N$.

Each switch circuit $SW_1$, $SW_2$, $SW_N$ is electrically connected with a common electric node NO that conveniently operates a different voltage potentials with respect to the third input terminal T+ of the DC/AC conversion section 1B, when the inverter 1 operates in the above-mentioned predefined test conditions and at least one of said switch circuits is in an interdiction state.

In practice, each switch circuit $SW_1$, $SW_2$, $SW_N$ is electrically connected with a common node NO that is not electrically connected in a direct matter with the third input terminal T+ of the DC/AC conversion section 1B so as to be equipotential with said third input terminal and at least one of said switch circuits is in an interdiction state.

This solution is quite advantageous as it allows substantially improving the accuracy of the isolation resistance measurements, which may otherwise be affected by relevant errors, if the common node was always equipotential with the third input terminal T+ of the DC/AC conversion section 1B, as it occurs in some known solutions of the state of the art.

According to some embodiments of the invention, each switch circuit $SW_1$, $SW_2$, $SW_N$ is electrically connected with the first input terminal IT+ of the corresponding DC input channel $CH_1$, $CH_2$, $CH_N$ or with an electric node (e.g. the first intermediate electric node N1) of the first electric line L+ of the corresponding DC input channel $CH_1$, $CH_2$, $CH_N$. Said electric node N1 is short-circuited (apart the presence of possible parasitic resistances) with the first input terminal IT+, when the inverter 1 operates at the above-mentioned test conditions.

According to alternative embodiments of the invention, each switch circuit $SW_1$, $SW_2$, $SW_N$ is electrically connected with the second input terminal IT− of the corresponding DC input channel $CH_1$, $CH_2$, $CH_N$ or with an electric node (e.g. the second intermediate electric node N2) of the second electric line L− of the corresponding DC input channel $CH_1$, $CH_2$, $CH_N$. Said electric node N2 is short-circuited (apart the presence of possible parasitic resistances) with the first input terminal IT−, when the inverter 1 operates at the above-mentioned test conditions.

Figure 3:
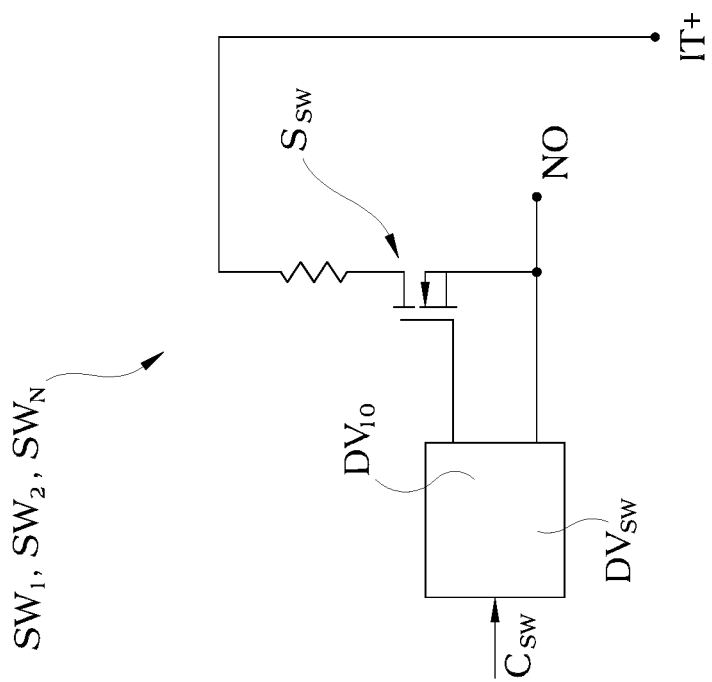

Preferably, each switch circuit $SW_1$, $SW_2$, $SW_N$ comprises a first resistive element $R_S$ and a third switch $S_{SW}$ (e.g. a MOSFET) electrically connected in series between the first input terminal IT+ and the common electric node NO (FIG. 3).

Preferably, each switch circuit $SW_1$, $SW_2$, $SW_N$ comprises a first driving circuit $DV_{SW}$ to suitably drive the third switch $S_{SW}$ in response to second control signals $C_{SW}$ received in input.

According to the invention, the above-mentioned measuring circuit arrangement comprises a first detection circuit 10.

Figure 4:
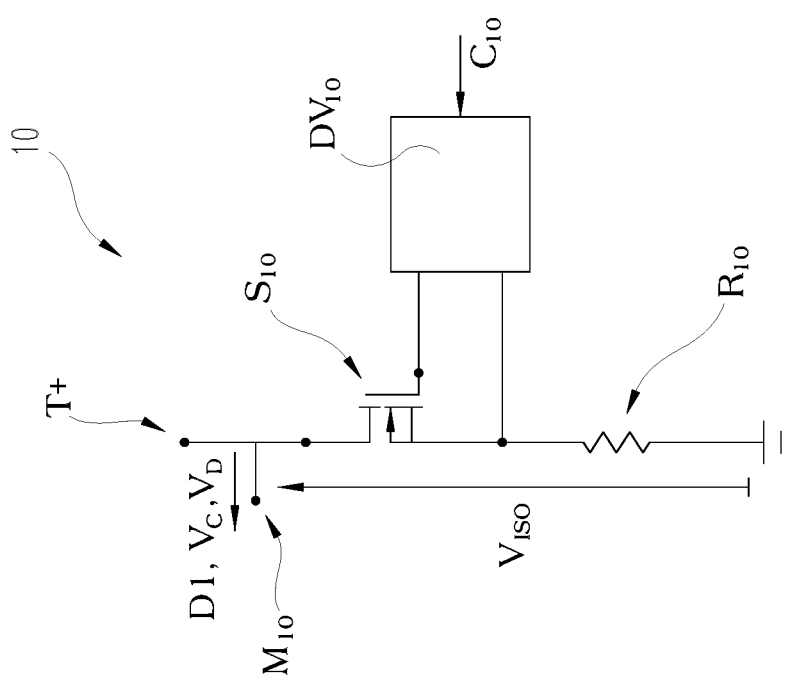

The first detection circuit 10 is adapted to provide first detection signals D1 indicative of a first voltage $V_{ISO}$ between the third input terminal T+ of the DC/AC conversion section 1B and the ground, when the inverter 1 operates at the above-mentioned test conditions (FIGS. 2, 2A, 4).

As it may be easily understood, the first voltage $V_{ISO}$ is indicative of the voltage difference between the operative voltage of the third input terminal T+ and the ground voltage, when the inverter 1 operates at the above-mentioned test conditions.

Preferably, the first detection circuit 10 comprises a first resistive element Rio and a fourth switch $S_{10}$ (e.g. a MOSFET) electrically connected in series between the third input terminal T+ and the ground.

Preferably, the first detection circuit 10 comprises a second driving circuit $DV_{10}$ to suitably drive the fourth switch $S_{10}$ in response to third control signals $C_{10}$ received in input.

Preferably, the first detection circuit 10 further comprises a first detection output Mio, at which it makes available the first detection signals D1.

As it will better emerge from the following, the arrangement of the first detection circuit 10 is essential to measure the isolation resistance $R_{ISO}$ of the photovoltaic strings 200.

Figure 6:
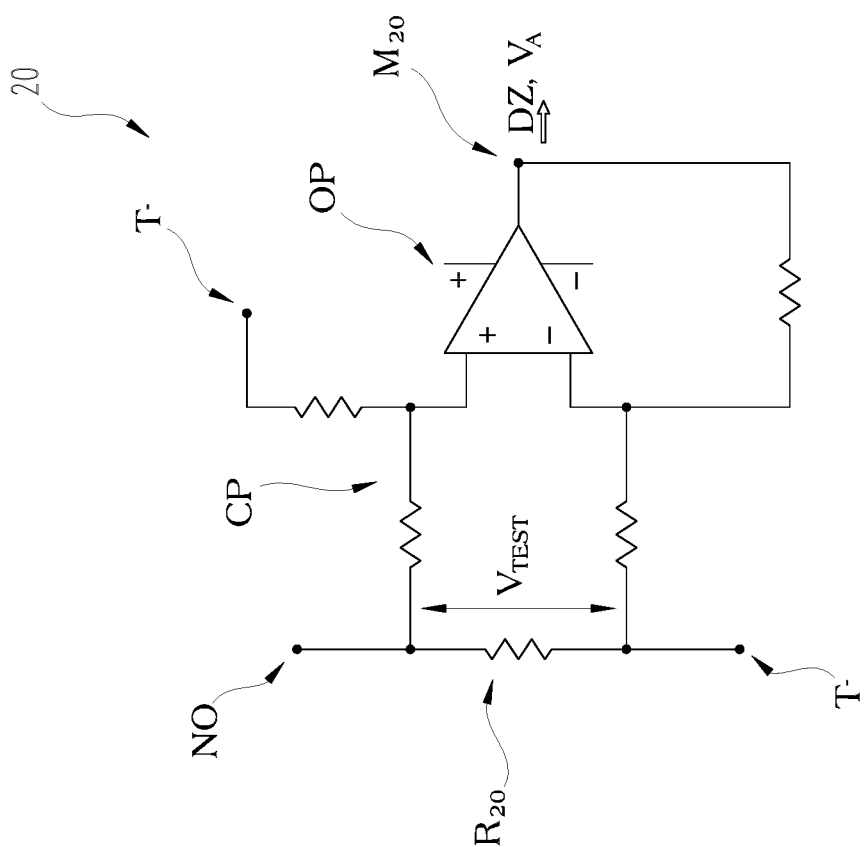

Preferably, the above-mentioned measuring circuit arrangement comprises a second detection circuit 20 adapted to provide second detection signals D2 indicative a second voltage $V_{TEST}$ between the common electric node NO and the fourth input terminal T− of the DC/AC conversion section 1B, when the inverter 1 operates at the above-mentioned test conditions (FIGS. 2, 2A, 6).

As it may be easily understood, the second voltage $V_{TEST}$ is indicative of the voltage difference between the operating voltage of the common electric node NO and the operating voltage of the fourth input terminal T−, when the inverter 1 operates in the above-mentioned test conditions.

Preferably, the second detection circuit 20 comprises a second resistive element $R_{20}$ electrically connected in series between the common electric node NO and the fourth input terminal T− and an operational circuit OP electrically connected in parallel with the second resistive element $R_{20}$ (FIG. 6).

Preferably, the operational circuit OP comprises an operational amplifier and a suitable polarization circuit CP electrically connected with the fourth input terminal T− to suitably drive said operational amplifier.

Preferably, the second detection circuit 20 comprises a second detection output $M_{20}$, at which it makes available the second detection signals D2.

Preferably, the above-mentioned measuring circuit arrangement comprises a third detection circuit 30 for each DC input channel $CH_1$, $CH_2$, $CH_N$.

Each third detection circuit 30 is adapted to provide third detection signals D3 indicative of a third voltage $V_{IN}$ between the first and second input terminals IT+, IT− of the corresponding DC input channel $CH_1$, $CH_2$, $CH_N$, when the inverter 1 operates in the above-mentioned test conditions.

As it may be easily understood, the third voltage $V_{IN}$ is indicative of the voltage difference between the operating voltages of the first and second input terminals IT+, IT− of the corresponding DC input channel $CH_1$, $CH_2$, $CH_N$, when the inverter 1 operates in the above-mentioned test conditions.

Figure 5:
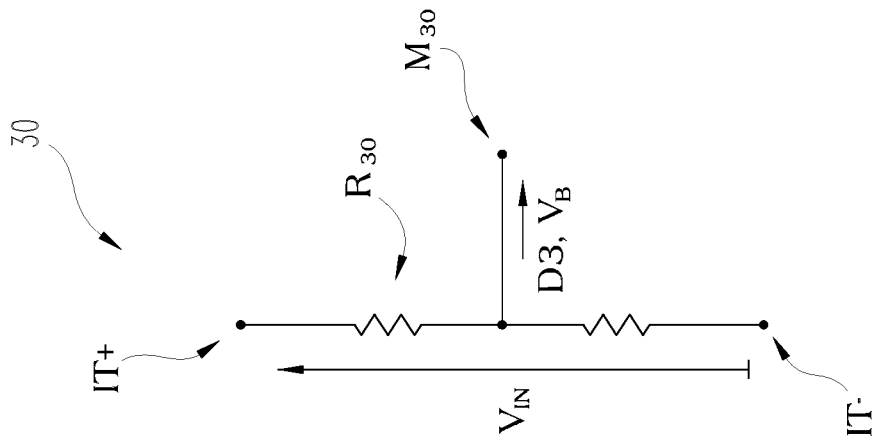

Preferably, each third detection circuit 30 is comprises a resistive shunt $R_{30}$ electrically connected in parallel with the first and second input terminals IT+, IT− of the corresponding DC input channel $CH_1$, $CH_2$, $CH_N$ (FIG. 5).

Preferably, each third detection circuit 30 comprises a third detection output $M_{30}$, at which it makes available the third detection signals D3.

As it will better emerge from the following, the arrangement of the second and third detection circuits 20, 30 is quite important to check the operating status of each switching circuit $SW_1$, $SW_2$, $SW_N$, preferably before carrying out a measurement of the isolation resistance $R_{ISO}$ of the photovoltaic strings 200.

According to the invention, the inverter 1 comprises a control section 1D operatively associated with the DC section 1A, the DC/AC conversion section 1B and the AC section 1C to control the operation of these latter.

The control section 1D may include one or more control boards or units, each of which may include one or more digital processing devices (e.g. microcontrollers, DSPs, and the like) and suitable electronic circuits of digital or analog type.

Conveniently, the control section 1D comprises suitable data processing means to carry out its functionalities, some of which (the first, second and third processing means 51, 52, 53) will be better described in the following.

If implemented in a digital manner, said data processing means may comprise suitably arranged software instructions stored in a medium and executable by one or more digital processing devices of the control section 1D to perform said functionalities.

If implemented in analog manner, said data processing means may comprise electronic circuits suitably arranged to perform said functionalities.

Additional variant solutions to implement said data processing means are available to the skilled person.

Preferably, the control section 1D is operatively coupled with the first and second switches S1, S2 of each DC/DC converter $CV_1$, $CV_2$, $CV_N$ and it is capable to provide first control signals (not shown) to control the operation of these latter switches.

Conveniently, the control section 1D is operatively coupled with each switch circuit $SW_1$, $SW_2$, $SW_N$ and it is capable to provide second control signals $C_{SW}$ to control the operation of the third switch $S_{SW}$ of each switch circuit $SW_1$, $SW_2$, $SW_N$.

Conveniently, the control section 1D is operatively coupled with the above-mentioned first detection circuit 10 (namely with the first detection output Mio and second driving circuit $DV_{10}$ thereof) to receive the first detection signals D1 and to provide third control signals $C_{10}$ to control the operation of the fourth switch $S_{10}$.

Preferably, the control section 1D is operatively coupled with the above-mentioned second detection circuit 20 (namely with the second detection output $M_{20}$ thereof) to receive the second detection signals D1.

Preferably, the control section 1D is operatively coupled with the above-mentioned third detection circuit 30 (namely with the third detection output $M_{30}$ thereof) to receive the third detection signals D3.

Preferably, the control section 1D comprises first data processing means 51 adapted to carry out MPPT (Maximum Power Point Tracking) functionalities by suitably controlling the DC/DC converters $CV_1$, $CV_2$, $CV_N$ of the input channels $CH_1$, $CH_2$, $CH_N$ and the DC/AC converters of the DC/AC conversion section 1B.

In order to carry out said MPPT functionalities, the first data processing means 51 may implement algorithms or procedures of known type that will be not described in the following for the sake of brevity.

Preferably, the control section 1D comprises second data processing means 52 configured to carry out a test procedure $P_T$ adapted to test the operating conditions of a switch circuit $SW_1$, $SW_2$, $SW_N$ operatively associated with a given DC input channel $CH_1$, $CH_2$, $CH_N$ of the DC section 1A.

The test procedure $P_T$ will now be described in details in accordance to a preferred embodiment of the invention.

The test procedure $P_T$ comprises a step of commanding the inverter 1 to take or maintain the above-mentioned predefined test conditions.

In order to implement this step, the second data processing means conveniently provides suitable control signals to the switches S1, S2 of each DC/DC converter $CV_1$, $CV_2$, $CV_N$ and suitable control signals to the DC/AC converters of the DC/AC conversion section 1B to maintain said switches i an interdiction state.

The test procedure $P_T$ then comprises the step of selecting an input channel (for example the input channel $CH_1$—FIGS. 2, 2A).

The test procedure $P_T$ then comprises the step of commanding the switching circuit $SW_1$ operatively associated with the selected input channel $CH_1$ to switch in a conduction state and the step of commanding the switching circuits $SW_2$, $SW_N$ operatively associated with the input channels $CH_2$, $CH_N$ different from the selected input channel $CH_1$ to switch in an interdiction state.

In order to implement this step, the second data processing means conveniently provides suitable control signals $C_{SW}$ to the driving circuits $DV_{SW}$ of the switching circuits SW$_1$, SW$_2$, SW$_N$ in such a way that the corresponding switches S$_{SW}$ are operated in an interdiction state or in a conduction state.

Following the above-mentioned steps, the common node NO becomes substantially equipotential with the first input terminal IT+ of the selected DC input channel CH$_1$ and its decoupled from the first input terminals IT+ of the remaining DC input channels CH$_2$, CH$_N$.

The test procedure P$_T$ then comprises the step of receiving the second detection signals D2 from said the detection circuit 20 and the step of receiving the third detection signals D3 from said third detection circuit 30.

The second detection signals D2 include one or more first voltage values V$_A$ indicative of the detected second voltage V$_{TEST}$ whereas the third detection signals D3 include one or more second voltage values V$_B$ indicative of the detected third voltage V$_{IN}$.

The test procedure P$_T$ then comprises the step of comparing the above-mentioned first and second voltage values V$_A$, V$_B$.

As the common node NO is substantially equipotential with the first input terminal IT+ of the selected DC input channel CH$_1$, the second and third voltages V$_{TEST}$ and V$_{IN}$ should have similar first and second voltage values V$_A$, V$_B$, if the switching circuit SW$_1$ operatively associated with the selected input channel CH$_1$ works properly. Otherwise, a substantial voltage difference between the first and second voltages V$_A$, V$_B$ will be certainly present.

The test procedure P$_T$ then comprises the step of determining a fault condition of the switching circuit SW$_1$ operatively associated with the selected input channel CH$_1$, if a voltage difference value between the second and third second voltages V$_{TEST}$, V$_{IN}$ exceeds a given voltage threshold value V$_{TH}$.

In practice, a fault condition of the switching circuit SW$_1$ operatively associated with the selected input channel CH$_1$ is determined if the following condition occurs:

$$|V_A - V_B| > V_{TH}$$

where V$_A$ is a first voltage value of the detected second voltage V$_{TEST}$, V$_B$ is a second voltage value of the detected third voltage V$_{IN}$ and V$_{TH}$ is the above-mentioned threshold value.

Preferably, the second data processing means 52 are configured to carry out the above-described test procedure P$_{TEST}$ for each DC input channel CH$_1$, CH$_2$, CH$_N$.

At each execution cycle of the test procedure P$_T$, the second processing means 52 will conveniently select a different DC input channel CH$_1$, CH$_2$, CH$_N$ to check the actual operative status of the corresponding switching circuit SW$_1$, SW$_2$, SW$_N$.

It is evidenced that at each execution cycle of the test procedure P$_T$, the common electric node NO always operates a different voltage potentials with respect to the third input terminal T+ of the DC/AC conversion section 1B, as N-1 switch circuits among the switching circuits switching circuit SW$_1$, SW$_2$, SW$_N$ are in an interdiction state.

The above-mentioned test procedure P$_T$ allows testing the actual operating status of the switching circuits SW$_1$, SW$_2$, SW$_N$ operatively associated with the DC input channels CH$_1$, CH$_2$, CH$_N$.

Conveniently, the actual operating status of the switching circuits SW$_1$, SW$_2$, SW$_N$ may be checked by carrying above-mentioned test procedure P$_T$ before measuring the isolation resistance R$_{ISO}$ of the photovoltaic strings 200

In this way, relevant measurement errors of the isolation resistance R$_{ISO}$ of the photovoltaic strings 200 may be preventively avoided with relevant advantages in terms of reliability and accuracy.

Preferably, the control section 1D comprises third data processing means 53 configured to carry out a measuring procedure P$_M$ adapted to measure the isolation resistance R$_{ISO}$ of the photovoltaic strings 200.

The measuring procedure P$_M$ will now be described in details in accordance to a preferred embodiment of the invention.

The measuring procedure P$_M$ comprises a step of commanding the inverter 1 to take or maintain the above-mentioned predefined test conditions.

In order to implement this step, the second data processing means conveniently provides suitable control signals to the switches S1, S2 of each DC/DC converter CV$_1$, CV$_2$, CV$_N$ and suitable control signals to the DC/AC converters of the DC/AC conversion section 1B to maintain said switches in an interdiction state.

The measuring procedure P$_M$ comprises a step of commanding the first switch S$_{10}$ of the first detection circuit 10 to switch in an interdiction state.

In order to implement this step, the third data processing means 53 conveniently provides suitable control signals C$_{10}$ to the driving circuits DV$_{10}$ of the switch S$_{10}$.

The measuring procedure P$_M$ comprises a step of receiving the first detection signals D1 indicative of the first voltage V$_{ISO}$. The first detection signals D1 include one or more third voltage values V$_C$ indicative of the detected first voltage V$_{ISO}$.

The measuring procedure P$_M$ then comprises a step of commanding the first switch S$_{10}$ of the first detection circuit 10 to switch in a conduction state.

In order to implement this step, the third data processing means 53 conveniently provides suitable control signals C$_{10}$ to the driving circuits DV$_{10}$ of the switch S$_{10}$.

The measuring procedure P$_M$ comprises a further step of receiving the first detection signals D1 indicative of the first voltage V$_{ISO}$. The first detection signals D1 include one or more fourth voltage values V$_D$ indicative of the detected first voltage V$_{ISO}$.

The measuring procedure P$_M$ then comprises a step of calculating the isolation resistance R$_{ISO}$ of the photovoltaic strings 200 basing on the third and fourth voltage values V$_C$, V$_D$.

In order to calculate the isolation resistance R$_{ISO}$, the third processing means 53 may adopt known algorithms of know type.

As an example, the isolation resistance R$_{ISO}$ may be calculated as:

$$R_{ISO} = \frac{((V_C - V_D) * R_{10})}{V_D}$$

where V$_C$ is a third voltage value of the detected first voltage V$_{ISO}$ with the switch S$_{10}$ in interdiction state, V$_D$ is a third voltage value of the detected first voltage V$_{ISO}$ with the switch S$_{10}$ in conduction state and Rio is the known resistance value of the first resistive element Rio of the first detection circuit 10.

The measuring procedure P$_M$ allows measuring the isolation resistance of the photovoltaic strings 200 in a simple manner by carrying out subsequent measurements of a single circuit point (the third input terminal T+ of the DC/AC conversion section 1B) with respect to the ground.

This constitutes an important advantages with respect to known MPPT inverters the state of the art where the voltages of multiple points of the DC section have to be measured to calculate the isolation resistance of the photovoltaic strings.

The present invention allows achieving the intended aims and objects.

The inverter 1 is provided with a measuring circuit arrangement that allows measuring the isolation resistance $R_{ISO}$ of the photovoltaic strings 200 in an accurate and reliable manner.

The measuring circuit arrangement employed in the inverter 1 is particularly adapted for use in an inverters is capable of providing MPPT functionalities and having the DC input channels $CH_1$, CN2, $CH_N$ without equipotential lines in common.

The inverter 1 has a compact structure with a relatively small size. The above-mentioned measuring circuit arrangement may in fact be easily integrated in the DC section 1A and it may employ MOSFETs or equivalent switching devices for its practical implementation.

The inverter 1 can be easily manufactured at industrial level with highly automated operations at competitive costs with respect to known solutions of the state of the art.

The invention claimed is:

1. An inverter for a photovoltaic apparatus, said inverter comprising a DC section, a DC/AC conversion section, an AC section and a control section, wherein said DC section includes a plurality of DC input channels, each DC input channel comprising:
   first and second input terminals adapted to be electrically connected with a corresponding photovoltaic string;
   first and second output terminals electrically connected with a third input terminal and a fourth input terminal of said DC/AC conversion section, respectively;
   a first electric line including said first input and output terminals and a second electric line including said second input and output terminals;
   a DC/DC converter electrically connected between said input terminals and said output terminals;
   wherein said DC section comprises a measuring circuit arrangement adapted to measure an isolation resistance of said photovoltaic strings, when said inverter operates in predefined test conditions, said measuring arrangement comprising:
   for each DC input channel, a switch circuit electrically connected with a common electric node operating at a different voltage potentials with respect to the third input terminal of said DC/AC conversion section, when said inverter operates in said test conditions and at least one of said switch circuits is in an interdiction state, said switch circuit being further electrically connected with:
      said first input terminal or an electric node of said first electric line that is short-circuited with said first input terminal, when said inverter operates in said test conditions; or
      said second input terminal or an electric node of said second electric line that is short-circuited with said second input terminal, when said inverter operates in said test conditions;
   a first detection circuit adapted to provide first detection signals indicative of a first voltage between the third input terminal of said DC/AC conversion section and the ground, when said inverter operates in said test conditions.

2. The inverter, according to claim 1, wherein said first detection circuit comprises a first resistive element and a switch electrically connected in series between the third input terminal of said DC/AC conversion section and the ground.

3. The inverter, according to claim 2, wherein said measuring circuit arrangement comprises a second detection circuit adapted to provide second detection signals indicative a second voltage between said common electric node and the fourth input terminal of said DC/AC conversion section, when said inverter operates in said test conditions.

4. The inverter, according to claim 3, wherein said second detection circuit comprises a second resistive element electrically connected in series between said common electric node and the fourth input terminal of said DC/AC conversion section and an operational circuit electrically connected in parallel with said second resistive element.

5. The inverter, according to claim 4, wherein said measuring circuit arrangement comprises, for each DC input channel, a third detection circuit adapted to provide third detection signals indicative of a third voltage between the first and second input terminals of said DC input channel, when said inverter operates in said test conditions.

6. The inverter, according to claim 5, wherein said third detection circuit comprises a resistive shunt electrically connected in parallel with the first and second input terminals of said DC input channel.

7. The inverter, according to claim 6, wherein said control section comprises first data processing means configured to carry out MPPT functionalities.

8. The inverter, according to claim 1, wherein said control section comprises second data processing means configured to carry out a test procedure adapted to test operating conditions of a switch circuit operatively associated with a DC input channel said test procedure operable to:
   command said inverter to take or maintain said predefined test conditions;
   select an input channel;
   command the switching circuit operatively associated with the selected input channel to switch in a conduction state;
   command the switching circuits operatively associated with input channels different from the selected input channel to switch in an interdiction state;
   receive said second detection signals including one or more first voltage values indicative of said second voltage;
   receive said third detection signals including one or more second voltage values indicative of said third voltage;
   compare said second voltage values with said third voltage values;
   determine a fault condition of the switching circuit operatively associated with the selected input channel, if a voltage difference value between said second and third second voltage values exceeds a given voltage threshold.

9. The inverter, according to claim 8, wherein said second data processing means are configured to carry out said test procedure for each DC input channel.

10. The inverter, according to claim 2, wherein said control section comprises third data processing means configured to carry out a measuring procedure to measure the isolation resistance of said photovoltaic strings, said detection procedure operable to:
    command said inverter to take or maintain said predefined test conditions;

command the first switch of said first detection circuit to switch in an interdiction state;
receive said first detection signals including one or more third voltage values indicative of said first voltage;
command the first switch of said first detection circuit to switch in a conduction state;
receive said first detection signals including one or more fourth voltage values indicative of said first voltage;
calculate said isolation resistance value basing on said third and fourth voltage values.

11. The inverter, according to that claim 1, wherein said DC/DC converter has a two-level boost configuration.

12. A photovoltaic apparatus comprising an inverter, according to claim 1.

13. The inverter, according to claim 1, wherein said measuring circuit arrangement comprises a second detection circuit adapted to provide second detection signals indicative a second voltage between said common electric node and the fourth input terminal of said DC/AC conversion section, when said inverter operates in said test conditions.

14. The inverter, according to claim 13, wherein said second detection circuit comprises a second resistive element electrically connected in series between said common electric node and the fourth input terminal of said DC/AC conversion section and an operational circuit electrically connected in parallel with said second resistive element.

15. The inverter, according to claim 1, wherein said measuring circuit arrangement comprises, for each DC input channel, a third detection circuit adapted to provide third detection signals indicative of a third voltage between the first and second input terminals of said DC input channel, when said inverter operates in said test conditions.

16. The inverter, according to claim 15, wherein said third detection circuit comprises a resistive shunt electrically connected in parallel with the first and second input terminals of said DC input channel.

17. The inverter, according to claim 16, wherein said control section comprises first data processing means configured to carry out MPPT functionalities.

18. The inverter, according to claim 1, wherein said control section comprises first data processing means configured to carry out MPPT functionalities.

19. The inverter, according to claim 7, wherein said control section comprises second data processing means configured to carry out a test procedure-adapted to test operating conditions of a switch circuit operatively associated with a DC input channel, said test procedure operable to:
command said inverter to take or maintain said predefined test conditions;
select an input channel;
command the switching circuit operatively associated with the selected input channel to switch in a conduction state;
command the switching circuits operatively associated with input channels different from the selected input channel to switch in an interdiction state;
receive said second detection signals including one or more first voltage values indicative of said second voltage;
receive said third detection signals including one or more second voltage values indicative of said third voltage;
compare said second voltage values with said third voltage values;
determine a fault condition of the switching circuit operatively associated with the selected input channel, if a voltage difference value between said second and third second voltage values exceeds a given voltage threshold.

20. The inverter, according to claim 19, wherein said DC/DC converter has a two-level boost configuration.

* * * * *